(12) United States Patent
Frigerio et al.

(10) Patent No.: US 12,385,781 B2
(45) Date of Patent: Aug. 12, 2025

(54) ELECTROMAGNETIC RADIATION SPECTRUM DETECTION SYSTEM

(71) Applicants: POLITECNICO DI MILANO, Milan (IT); UNIVERSITÀ DEGLI STUDI ROMA TRE, Rome (IT)

(72) Inventors: Jacopo Frigerio, Milan (IT); Giovanni Isella, Milan (IT); Andrea Ballabio, Milan (IT); Andrea De Iacovo, Rome (IT); Lorenzo Colace, Rome (IT)

(73) Assignee: Politecnico di Milano, Milan (IT)

( * ) Notice: Subject to any disclaimer, the term of this patent is extended or adjusted under 35 U.S.C. 154(b) by 221 days.

(21) Appl. No.: 18/007,447

(22) PCT Filed: Jul. 29, 2021

(86) PCT No.: PCT/IB2021/056905
§ 371 (c)(1),
(2) Date: Jan. 30, 2023

(87) PCT Pub. No.: WO2022/024021
PCT Pub. Date: Feb. 3, 2022

(65) Prior Publication Data
US 2023/0288256 A1    Sep. 14, 2023

(30) Foreign Application Priority Data

Jul. 31, 2020   (IT) .................. 102020000018709

(51) Int. Cl.
*G01J 3/28*    (2006.01)
*G01J 3/02*    (2006.01)
*H10F 39/18*   (2025.01)

(52) U.S. Cl.
CPC .......... *G01J 3/2823* (2013.01); *G01J 3/2803* (2013.01); *G01J 3/0275* (2013.01);
(Continued)

(58) Field of Classification Search
CPC . H01L 27/14652; G01J 3/0275; G01J 3/2826; G01J 3/2823
See application file for complete search history.

(56) References Cited

U.S. PATENT DOCUMENTS

| 5,923,049 A | 7/1999 | Böhm et al. |
| 6,518,558 B1 | 2/2003 | Böhm et al. |

(Continued)

OTHER PUBLICATIONS

De Iacovo Andrea et al., Design and Simulation of Ge-on-Si Photodetectors With Electrically Tunable Spectral Response, pp. 3517-3525 , Jul. 15, 2019, vol. 37, No. 14, Journal of Lightwave Technology.

(Continued)

*Primary Examiner* — Maurice C Smith
(74) *Attorney, Agent, or Firm* — Widerman Malek, PL; Mark Malek; Jonathan Staudt

(57) ABSTRACT

An electromagnetic radiation spectrum detection system including a sensor device and an electronic control and processing module. The sensor device may include two photodiodes. The sensor device may convert an incident electromagnetic radiation (EMR) into electrical current. The electronic control and processing module may store numerical calibration values representative of a responsivity matrix of the sensor device. The electronic control and processing module may selectively provide the sensor device with electrical control voltage values ($V_B$). The electronic control and processing module may process the values of detected electric currents (Iph) and the numerical calibration values to obtain spectrum information related to incident electromagnetic radiation spectrums. The electronic control and processing module may determine power spectral density of incident electromagnetic radiation.

14 Claims, 6 Drawing Sheets

(52) U.S. Cl.
CPC .......... *G01J 2003/2813* (2013.01); *G01J 2003/2826* (2013.01); *H10F 39/1847* (2025.01)

(56) References Cited

U.S. PATENT DOCUMENTS

| | | | | |
|---|---|---|---|---|
| 2010/0051809 | A1* | 3/2010 | Onat | H01L 31/1035 |
| | | | | 250/332 |
| 2015/0069217 | A1* | 3/2015 | Taylor | H01L 27/14652 |
| | | | | 257/14 |
| 2016/0087000 | A1* | 3/2016 | Inada | H01L 27/14694 |
| | | | | 250/338.4 |
| 2019/0017871 | A1* | 1/2019 | Choi | G01J 3/28 |

OTHER PUBLICATIONS

Simola E. Talamas et al., Voltage-tunable dual-band Ge/Si photodetector operating in VIS and NIR spectral range, research article, Mar. 8, 2019, vol. 27, No. 6, Optics Express.

* cited by examiner

ELECTROMAGNETIC RADIATION SPECTRUM DETECTION SYSTEM

TECHNICAL FIELD

The present invention relates to a system for detecting the spectrum of an electromagnetic radiation. In particular, the present invention relates to spectral analysis systems and hyperspectral imaging systems.

STATE OF THE ART

As is well known, spectral analysis (spectroscopy and spectrography) concerns the measurement of radiation intensity as a function of wavelength.

Hyperspectral imaging is a measurement technique that allows to acquire, for each point of an image, spectral information.

A known method to measure spectrally resolved images is to place one or more bandpass filters, or a dispersive element, between the object and a camera or to use a multi-channel detector, acquiring an image for each spectral band. The number of bands measured and the spectral width of each band depends on the characteristics of the filters or dispersive element and the detector used. This technique, which acquires spectral information in a discrete set of optical bands, is also called a multi-spectral imaging technique. Document WO2014063117 A1 "Single-sensor hyperspectral imaging device," describes a multi-pixel sensor in which an array of nine filters arranged in front of the pixels is developed to reconstruct a multispectral image in different bands of the electromagnetic spectrum.

Another known approach, based on Fourier transform spectroscopy, uses an interferometer between the object and the detector. The paper J. Craven-Jones et al. "Infrared hyperspectral imaging polarimeter using birefringent prisms," Applied Optics, Vol. 50, No. 8, Mar. 10, 2011 describes a hyperspectral imaging polarimeter in the near and mid-infrared; the system includes a pair of sapphire Wollaston prisms and several high-order retarders to form a Fourier transform imaging spectro-polarimeter.
The Wollaston prism is used as a birefringence-based interferometer that offers reduced vibration sensitivity compared to a path division interferometer such as the Michelson interferometer. Polarimetric data are acquired through the use of a channel spectropalarimeter to modulate the spectrum with Stokes parameter information. The acquired interferogram is filtered and reconstructed by Fourier transform in order to extract the spatially and spectrally resolved Stokes vectors of the image.

The paper A. R. Harvey et al. "Birefringent Fourier-transform imaging spectrometer", OPTICS EXPRESS 5368 No. 22, Vol. 12, 1st November 2004 describes a birefringent Fourier-transform imaging spectrometer based on an input polarizer, two Wollaston prisms arranged in cascade (one fixed and the other movable) a second polarizer and a lens to form an image.

Document U.S. Pat. No. 7,800,067B1 "Electronically tunable and reconfigurable hyperspectral photon detector" describes a light sensor capable of collecting spectral information by exploiting the depletion zone of a diode in which the material composition is changed linearly along the depletion zone.

The paper E. Talamas Simola et al. "Voltage-tunable dual-band Ge/Si photodetector operating in VIS and NIR spectral range" Vol. 27, No. 6; Mar. 18, 2019, OPTICS EXPRESS 8529, describes a device having an epitaxial germanium-on-silicon structure comprising two photodiodes connected back-to-back and such as to operate as a photodetector for a wide band of wavelengths.

SUMMARY OF THE INVENTION

Applicant has noted that spectrum detection systems of the prior art (such as, for example, hyperspectral imaging systems) appear structurally complex in that they require the use of optical components (such as, filters, prisms, dispersive elements) or mechanical components (e.g., MEMS Micro Electro-Mechanical Systems) in order to reconstruct the incident spectrum.

The present invention addresses the problem of providing a spectrum detection system (such as to operate, in particular, as a spectral analysis or hyperspectral imaging system) that is less structurally complex than systems of known art.

The present invention relates to a spectrum detection system as described by claim 1 and preferred embodiments thereof as defined by claims 2-14.

BRIEF DESCRIPTION OF THE DRAWINGS

The present invention is hereinafter described in detail, by way of example and not limitation, with reference to the accompanying drawings, in which.

DETAILED DESCRIPTION

In this description, similar or identical elements or components will be indicated in the figures by the same identifying symbol.

Figure 1:
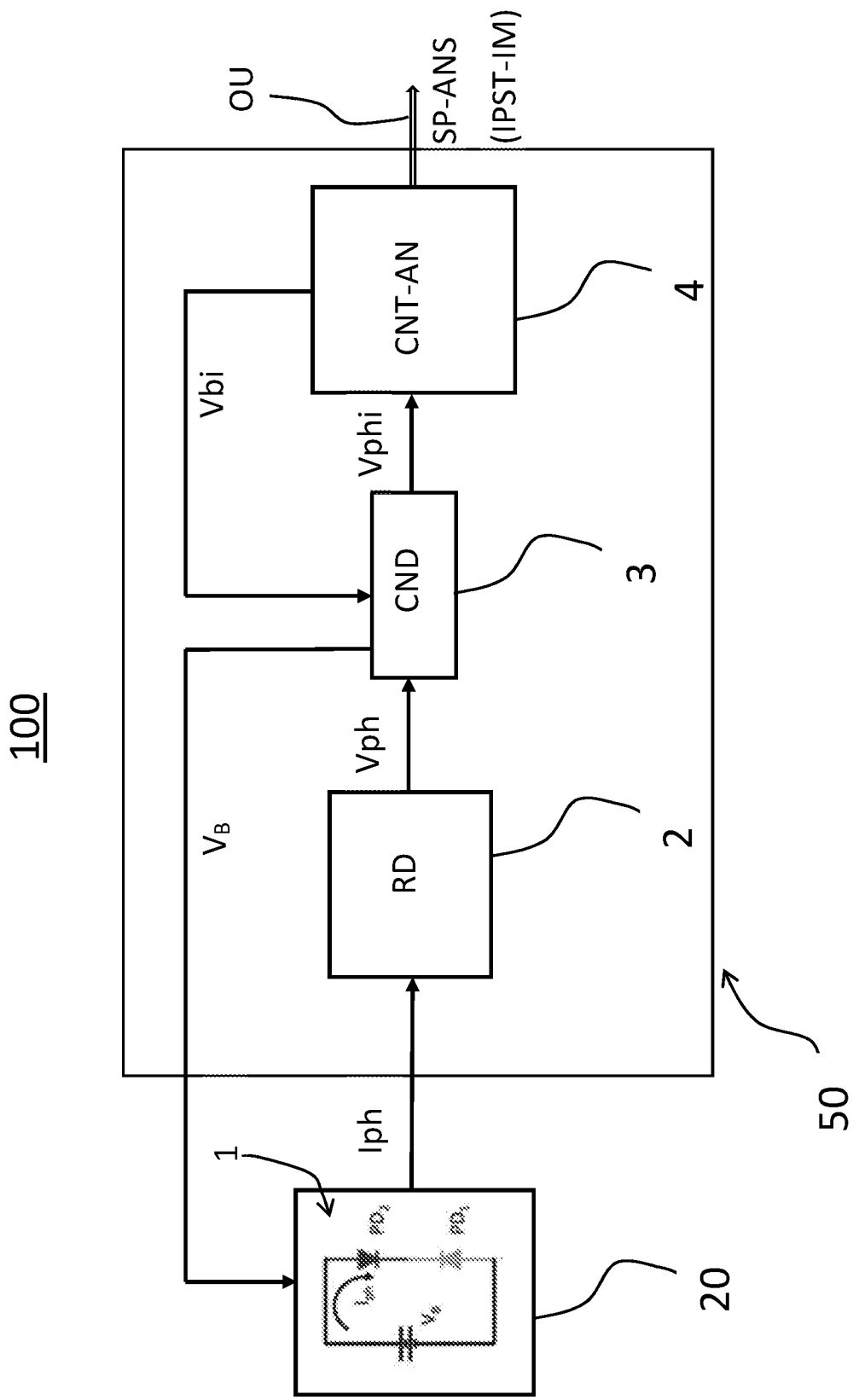
FIG. 1 schematically shows a spectrum detection system comprising an electromagnetic radiation sensor apparatus and an electronic control and processing module.

FIG. 1 schematically shows a spectrum detection system 100 comprising an electromagnetic radiation sensor apparatus 20 and an electronic control and processing module 50. In more detail, the electronic control and processing module 50 is configured to extract and provide on an output OU information related to the spectrum of radiation illuminating the sensor 1. The electronic control and processing module 50 includes a readout module 2 (RD), a conditioning module 3 (CND), and an analysis and control device 4 (CNT-AN).

According to a first embodiment, described below, the spectrum detection system 100 may be configured to perform spectral analysis of an electromagnetic radiation by providing on the output OU information SP-ANS relating to the measurement of the intensity of the incident radiation as a function of wavelength.

The electromagnetic radiation sensor apparatus 20 includes a sensor device or photodetector device 1 (hereinafter, for brevity, "sensor") of the two photodiode (i.e., double photodiode) type in a back-to-back configuration. As will also be mentioned later, the sensor 1 is configured to convert an incident electromagnetic radiation into an electric current, depending on a relative spectral responsivity dependent on an electrical control voltage.

For the purposes of spectral analysis of electromagnetic radiation, the sensor apparatus 20 may include a single sensor 1.

As schematically represented in FIG. 1, sensor 1 includes a first photodiode PD1 and a second photodiode PD2 (hereinafter, also referred to as first and second "diodes", for brevity) arranged in a "back-to-back" configuration i.e., with cathodes (or anodes) electrically connected to each other. These first and second diodes PD1 and PD2 are regulated by applying an appropriate voltage ($V_B$) to the remaining anodes (or cathodes), connected to the control and processing circuit 50.

In particular, the first photodiode PD1 is obtained from a semiconductor material with energy gap $E_{g1}$ and the second photodiode PD2, is obtained from another semiconductor material with energy gap $E_{g2} < E_{g1}$.

The first diode PD1 is configured to collect and convert into an electrical signal (i.e., a photocurrent Iph) the radiation with wavelength λ between a first minimum wavelength $\lambda_{min}(PD1)$ and a first maximum wavelength $\lambda_{max}(PD1) = hc/E_{g1}$ (with hc universal constants).

The second photodiode PD2 is configured to collect and convert into an electrical signal (a corresponding photocurrent Iph) the radiation with wavelengths ranging from a second minimum wavelength $\lambda_{min}(PD2)$ to a second maximum wavelength $\lambda_{max}(PD2) = hc/E_{g2}$ with $\lambda_{min}(PD2) < \lambda_{max}(PD1)$.

For example in the case of silicon, indicative values of $\lambda_{min}(PD1)$ and λmax(PD1) are 400 nm and 1100 nm respectively, and in the case of germanium, indicative values of λmin(PD2) and $\lambda_{max}(PD2)$ would be 400 nm and 1800 nm respectively.

Figure 2:
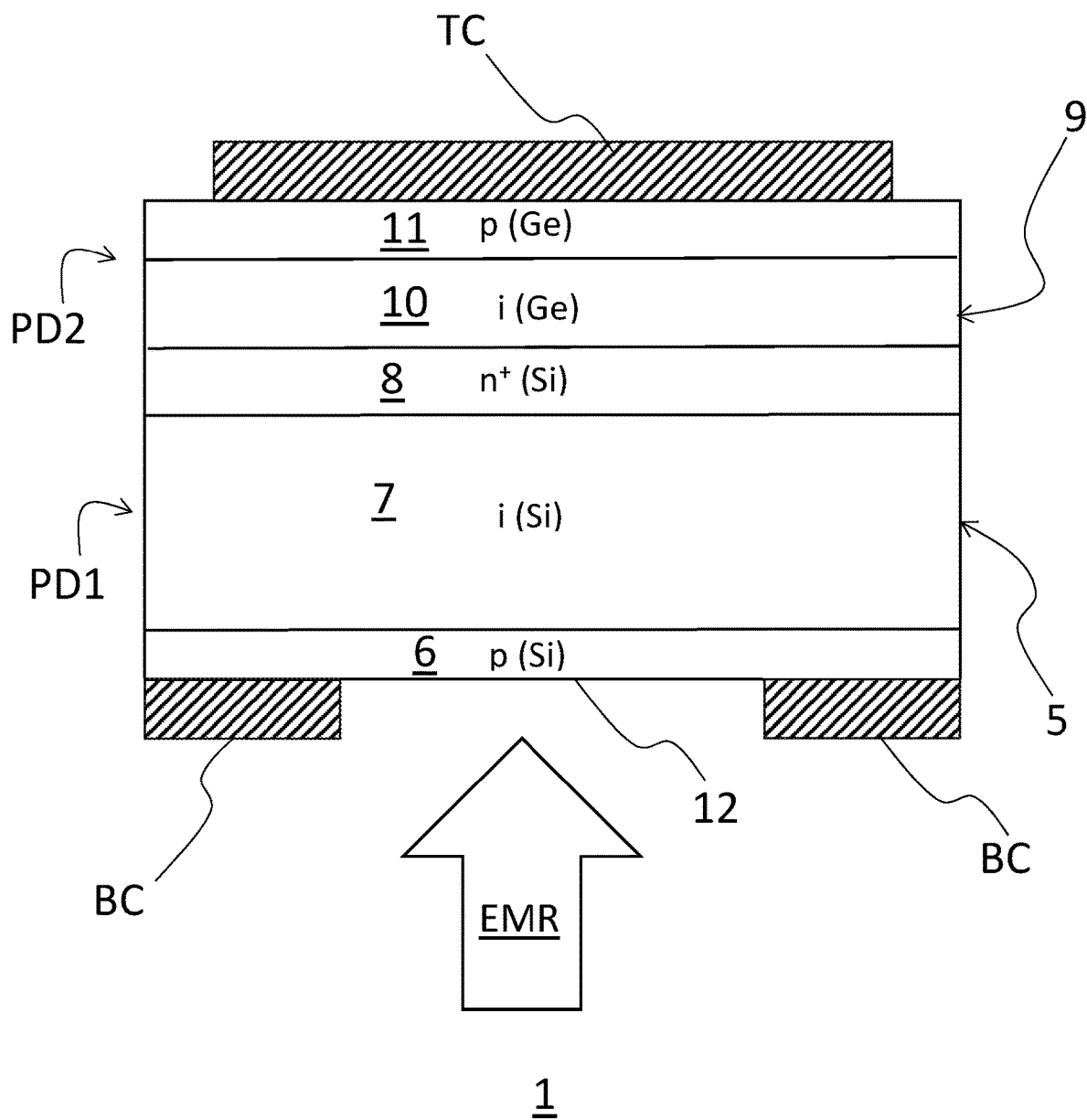
FIG. 2 shows a section of a first realization of a semiconductor sensor included in said apparatus including two photodiodes.

FIG. 2 shows a first exemplary embodiment of the sensor 1 that will be described making, by way of example, reference to the materials silicon and germanium. According to the described example, the first photodiode PD1 is a p-i-n (p-type, intrinsic, n-type) diode made of silicon while the second photodiode PD2 is a p-i-n (p-type, intrinsic, n-type) diode made of germanium.

In greater detail, the sensor 1 includes a substrate 5 made of a first semiconductor material (silicon, according to the example) comprising, in turn, a first p-type doped layer 6 and a first intrinsic layer 7(i), superimposed on the first layer 6. A second doped layer 8 of n+ type (i.e., levated doping), is superimposed on the first intrinsic layer 7.

According to the embodiment of FIG. 2, the first doped layer 6 (anode), the first intrinsic layer 7, and the second doped layer 8 (cathode) form the first PD1 diode of p-i-n type.

The first diode PD1, being made of silicon, is such as to collect and convert into an electrical signal (i.e., the current Iph) the radiation in the visible and near infrared and then the radiation having, indicatively, a minimum wavelength $\lambda_{min}(PD1)$ of 400 nm and a maximum wavelength $\lambda_{max}(PD1)$ of 1100 nm. The VIS (Visible) band is, as known, included in the wavelength range 400 nm-700 nm. The Near InfraRed (NIR) band extends from 700 nm to 1100 nm.

Regarding the first diode PD1 (silicon), it is advantageous that the thickness of the first intrinsic layer 7 is between 50 μm and 300 μm. Note that lesser thicknesses do not, in fact, allow the silicon to absorb all the incident radiation while, on the contrary, greater thicknesses impair the collection efficiency of the photogenerated charges.

In addition, to ensure the proper operation of the sensor 1, it is preferable that the first intrinsic silicon layer 7 has a background doping of type n. In this way, the photogenerated charges in the silicon can be effectively transported along the structure with a low recombination rate thus ensuring a high efficiency.

According to a particular example, the following size values can be adopted for the first PD1 diode:
 the first doped layer 6 (Si-p) has a thickness of about 200 nm and is doped with boron atoms with concentration equal to $10^{19}$ cm$^{-3}$;
 the first intrinsic silicon layer 7 has a thickness of about 300 μm;
 the second doped layer 8 (Si, n+) has a thickness of about 150 nm with a dopant concentration of $10^{19}$ cm$^{-3}$.

In addition, the sensor 1 includes a layer made of a second semiconductor material 9 (made of germanium, according to the example) superimposed on the second doped layer 8 of the first diode PD1 in which part of the second diode PD2 is integrated. In greater detail, the germanium layer 9 includes a second intrinsic layer 10 disposed above the second doped layer 8, and a third n-type doped layer 11 superimposed on the second intrinsic layer 10. The second diode PD2 comprises the second doped layer 8 (i.e., a cathode shared with the first diode PD1), the second intrinsic layer 10, and the third doped layer 11, which acts as an anode.

Note that, according to an alternative structure, the n-type layer of the second PD2 diode might not be shared with the first PD1 diode, as in FIG. 2 (i.e., the second doped layer 8) but might be realized by a related germanium layer.

The second diode PD2 made at least partially of germanium, is configured to collect and convert into an electrical signal (i.e., current Iph) the radiation having, indicatively, minimum wavelength $\lambda_{min}(PD2)$ 400 nm and maximum wavelength $\lambda_{max}(PD2)$ of 1800 nm.

As known, the near infrared band NIR (Near InfraRed) extends from 700 nm to 1100 nm, while the short wave infrared band SWIR (Short Wave InfraRed) is included in the wavelength range 1100 nm-3000 nm.

In other words, the sensor 1, if fabricated using silicon for the photodiode PD1 and germanium for the photodiode PD2 as shown in the particular realization form in FIG. 2, can operate in the visible, near infrared up to part of the shortwave infrared.

Note that it is advantageous for the germanium layer 9 of the second PD2 diode to have a thickness greater than 1 μm; in fact, lower thicknesses do not allow the germanium to absorb all of the incident radiation and would result in an overall decrease in responsivity.

For example, the following size values can be adopted for the germanium layers of the second PD2 diode:
 the thickness of the second intrinsic layer 10 (i-Ge) is about 3 μm;
 the thickness of the third doped layer 11 (p-Ge) is 150 nm; with a dopant concentration of $10^{18}$ cm$^{-3}$.

Note that to increase the variability of the responsivity curves as the voltage applied to sensor 1 changes, it is also possible to fabricate the second germanium PD2 diode with a pn diode, in which the n-type germanium layer is less doped than the p-type germanium layer. Moreover, in this case, the p-type layer has an overall thickness of no more than 200 nm. In fact, higher thicknesses would reduce the overall efficiency of sensor 1.

The sensor 1 also has a first ohmic contact BC made on a free face (i.e., not in contact with the first intrinsic layer 7) of the first doped layer 6. A second ohmic contact TC is formed on a face of the third doped layer 11, not in contact with the second intrinsic layer 10. The first ohmic contact BC and the second ohmic contact TC may be made, for example, as metal contacts, in particular, gold.

The first ohmic contact BC is made so as to define an exposed region 12 of a face of the first doped layer 6, on which the EMR electromagnetic radiation may affect.

The sensor 1 can be fabricated using semiconductor device fabrication techniques known to the skilled person in the art including, but not limited to: implantation techniques, spin-on dopant and deposition techniques (including: epitaxy, sputtering, evaporation), transfer as wafer bonding.

Regarding the operation of sensor 1, note that the bias voltage $V_B$ is conventionally understood as the voltage difference between the second ohmic contact TC and the first ohmic contact BC. According to this definition, for positive bias voltages $V_B$, the second diode PD2 is directly biased and the first diode PD1 is inversely biased, and vice versa for negative voltages $V_B$.

When the sensor 1 is illuminated from the side of the semiconductor with energy gap $E_{g1}$ (i.e., at the exposed region 12 of the diode PD1, according to the example), the first photodiode PD1 will absorb the portion of the higher-energy light radiation, and the second photodiode PD2 will be illuminated by the only light radiation that cannot be absorbed by the gap semiconductor $E_{g1}$.

The photodiode realized with the gap semiconductor $E_{g1}$ (i.e. the first diode PD1) is, therefore, able to generate photocurrent only in the presence of a light radiation at low wavelength ($\lambda < hc/E_{g1}$, with hc universal constants) while, on the contrary, the second photodiode PD2 responds only to photons with $\lambda_{max}(PD1) < \lambda < \lambda_{max}(PD2)$. The total photocurrent generated by sensor 1 will be given by the difference between the photocurrents generated by the two different photodiodes.

More in detail, when the first diode PD1 is inversely biased it is able to generate the photocurrent Iph when illuminated with radiation with wavelength $\lambda$ between $\lambda$min (PD1) and $\lambda$max(PD1), while the second diode PD2 is directly biased and is therefore optically inactive, but allows the circulation of the current Iph.

Vice versa, when the second diode PD2 is reverse biased it is able to generate the photocurrent Iph (if illuminated with radiation wavelength $\lambda$ between $\lambda$max(PD1) and $\lambda$max (PD2), while the first diode PD1 is direct biased and is therefore optically inactive, but allows the circulation of the current Iph.

Figure 3:
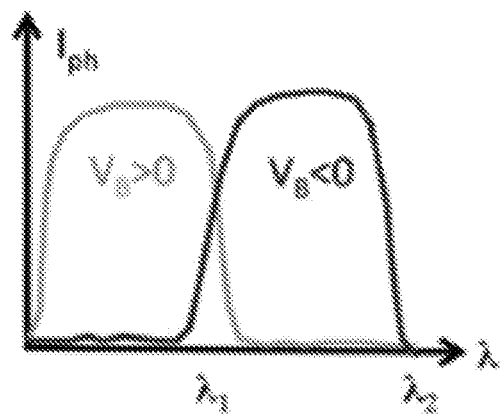
FIG. 3 shows an example of the trend of the current generated by the sensor as a function of wavelength and control voltage.

Acting on the bias voltage VB, through the analysis and control device 4, it is possible to electrically select the spectral response of the sensor 1. FIG. 3 shows, as an example, the trend of the current Iph as a function of wavelength, for two extreme values of the bias voltage $V_B$.

Depending on the applied bias voltage $V_B$ it will be possible to modify the collection efficiency of the two junctions; in particular, as the collection efficiency of the junction with gap $E_{g1}$ increases, a decrease in the collection efficiency of the junction with gap $E_{g2}$ will be observed and vice versa. This approach allows the responsivity spectrum of sensor 1 to vary continuously.

Figure 7:
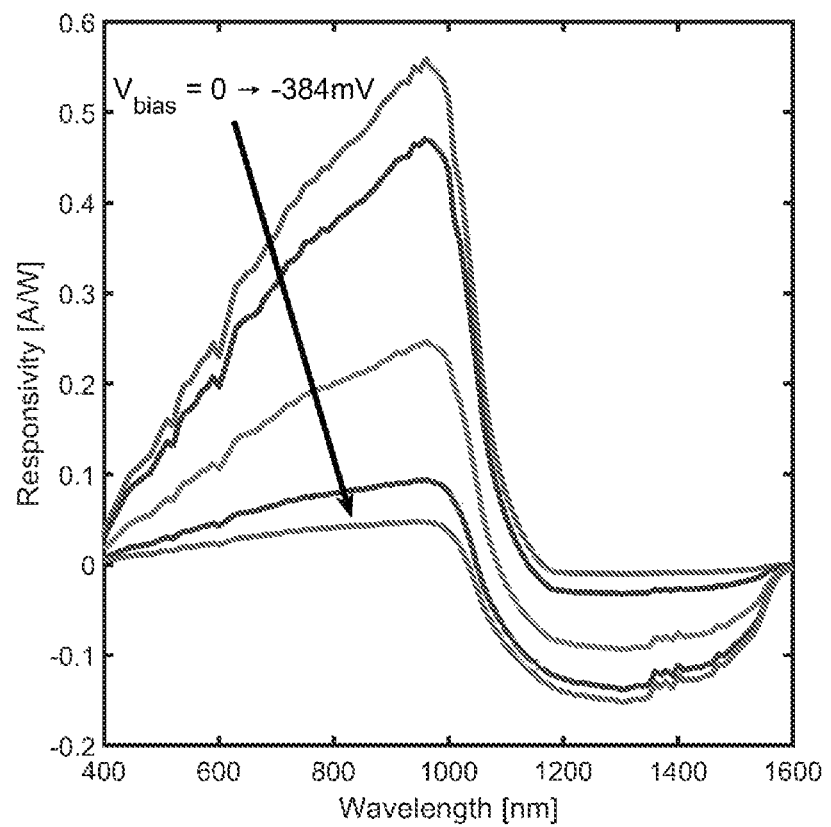
FIG. 7 shows a set of sensor responsivity curves as a function of the voltage difference applied to said sensor, given a certain incident radiation.

FIG. 7 shows a set of responsivity curves of sensor 1 as a function of the voltage difference applied to the sensor given some incident radiation. The curves in FIG. 7 are curves obtained experimentally with reference to a structure analogous to that of FIG. 2.

Note that although in the example of FIG. 1 we referred to the use of silicon and germanium, the sensor 1 can be manufactured from other semiconductor materials. For example, other possible materials capable of satisfying the aforementioned relationships between the photoresponse bands of the first diode PD1 and/or the second diode PD2 include semiconductor materials chosen from one of the following types:
 a) III-V semiconductors (e.g., GaAs, InAs, InP) and alloys thereof;
 b) II-VI semiconductors (e.g., ZnSe, ZnTe, CdSe, CdTe, HgTe, PbS, PbSe) and their alloys;
 c) IV semiconductors (e.g., Si, Ge, GeSn) and their alloys.

With respect to the control and processing module 50, note that the readout module 2 is configured to convert the current signal Iph to a voltage signal Vph and includes, for example, a trans-impedance amplifier (not shown). Note that, advantageously, the current signal Iph is obtained sequentially as the bias voltage $V_B$ varies. Note that a single readout module 2 (with a single one trans-impedance amplifier) is employable for conversion of all Iph current signals obtained as the bias voltage $V_B$ varies.

The conditioning module 3 is configured to treat the voltage signal Vph in a manner that makes it suitable for subsequent processing. For example, the conditioning module 3 performs operations such as amplification, filtering, level adaptation, dark current cancellation, and an analog-to-digital conversion of the voltage signals Vph to digital values Vphi. Note that a single conditioning module 3 is suitable for processing the voltage signal Vph obtained in varying bias voltage $V_B$.

The analysis and control device 4 is configured to receive digital values Vphi representative of voltage signals Vph, corresponding to photo-current signals generated by the sensor 1 for various bias voltages $V_B$, and perform a spectral analysis of the radiation invading the sensor 1. The analysis and control device 4 may include programmable logic (e.g., ASIC/FPGA) configured to perform such a spectral analysis.

In addition, the analysis and control device 4 is configured to generate digital voltage values Vbi which, by appropriate conditioning (which can be carried out by the conditioning module 3) are transformed into analog values of the bias voltage $V_B$ to be applied to the sensor 1 to vary its spectral response.

The control and processing module 50 is, for example, a ROIC (ReadOut Integrated Circuit) that can be integrated directly into the silicon substrate used to make the first photo-diode PD1. Alternatively, the sensor 1 and ROIC 50 may be manufactured on two different substrates and then connected via bump-bonding or wafer-bonding techniques. Alternatively, the sensor 1 and the ROIC 50 may be fabricated on different substrates and then connected via a PCB electronic board.

As mentioned above, the sensitivity spectrum of sensor 1 can be continuously modified; in particular, it is possible to obtain numerous spectral responses intermediate to the extreme ones (obtainable by applying the maximum or minimum bias voltage) shown in FIG. 3. For example, the bias voltage $V_B$ is varied with a step between 7 mV and 16 mV and preferably with a step between 8 mV and 13 mV. Note that using a step of 10 mV may result in a spectral resolution of less than 50 nm. This property offers the possibility of obtaining a large number of spectra, dynamically tunable through the application of the bias voltage $V_B$ and extended in the visible and near-infrared range, allowing the realization of a compact spectral analysis system.

Note that the spectral analysis is based on the knowledge of the spectral responsivity of the sensor 1, this spectral responsivity is determined in a characterization step.

The spectral analysis performed by the analysis and control device 4, is based on the considerations below. Consider a finite number n of bias voltages of the sensor 1 and a finite number m of analyzed wavelengths; the following matrix equation (1) is valid:

$$\overline{\iota_{ph}} = \overline{R} P \quad (1)$$

Where:
$\overline{\iota_{ph}}$ is a vector containing the measured photocurrents at different bias voltages $V_{Bn}$;
$\overline{R}$ is an n×m matrix in which each row represents the spectral responsivity of sensor 1 to a given bias voltage $V_{Bn}$;
$P$ is a vector of length m representing the power spectral density of the incident radiation.

The values of the vector $\overline{\iota_{ph}}$ of photocurrents are obtained sequentially at different values of the bias voltages $V_{Bn}$.

The matrix $\overline{R}$, obtained through the characterization of sensor 1, is ideally immutable over time.

According to one mode of analysis, the rows of the matrix $\overline{R}$ are linearly combined to obtain a vector $\overline{R_{eq}}$. This vector represents a "synthetic" responsivity spectrum, not directly obtainable at a specific bias voltage but computable as a linear combination of the responsivity spectra naturally associated with sensor 1. The calculation of $\overline{R_{eq}}$ is performed according to the following equation (2), where $\overline{\beta}$ is a vector of numerical coefficients of length n.

$$\overline{R_{eq}} = \overline{\beta} \overline{R} \quad (2)$$

Multiplying by $\overline{\beta}$ both members of eq. 1 yields, therefore, what is reported in equation (3), from which it can be seen that the product $\overline{\beta} \overline{\iota_{ph}}$ represents the photocurrent of a "synthetic" sensor equipped with the responsivity spectrum $\overline{R_{eq}}$ and invested by the radiation $\overline{P}$.

$$\overline{\beta} \overline{\iota_{ph}} = \overline{\beta} \overline{R} P = \overline{R_{eq}} P \quad (3)$$

Note that if the responsivities contained in the $\overline{R}$ matrix were all linearly independent, it would be possible to derive the $\overline{\beta}$ coefficients in closed form using an analytical procedure.

Consequently, it would be possible to generate $\overline{R_{eq}}$ Dirac delta functions centered at wavelengths within the sensitivity spectrum of sensor 1 and obtain a series of photocurrents proportional to the power spectral density of the incident radiation.

In case one does not have a device capable of generating a set of linearly independent responsivity curves, it is possible to use a least squares fitting approach to calculate the $\overline{\beta}$ coefficients, in order to approximate Gaussian functions $\overline{R_{eq}}$.

The use of this approach allows to approximate the coefficients $\overline{\beta}$ even when it is not, instead, possible to calculate them in closed form. The use of functions $\overline{R_{eq}}$ of Gaussian type, moreover, allows to approximate the Dirac functions δ allowing, at the same time, to simplify the fitting procedure; the functions δ, in fact, present discontinuities that make particularly difficult the calculation of the parameters $\overline{\beta}$.

Sensor 1, based on the germanium-silicon structure described above, allows the responsivity spectrum to vary continuously, resulting in a plurality of sparsely correlated responsivity curves.

Thus, as also expressed by equation (3), the spectral analysis associated with the spectral density vector $\overline{P}$, is performed by a series of linear combinations ($\overline{\beta} \overline{\iota_{ph}}$) among the photo-current values acquired for different $V_{Bn}$ bias voltages. In this way, the spectral responsivities obtained as the bias voltage varies can be weighted and evaluated as a whole, allowing extrapolation of the light intensity (spectral density $\overline{P}$) incident on sensor 1 over a very narrow range of wavelengths (ideally, 1 nm).

The weight values, represented by the $\overline{\beta}$ vector, required for the correct execution of the linear combination of photocurrents are derived during the characterization phase of the image sensor and are not subject to change over time.

In particular, during a preliminary calibration phase of sensor 1, the responsivity matrix $\overline{R}$ is obtained by laboratory analysis of the photoresponse as the bias voltage $V_B$ varies. Then, the vector of weights $\overline{\beta}$ is determined by a least-squares fit procedure in order to obtain a synthetic responsivity set $\overline{R_{eq}}$ of bandpass type. The vector $\overline{\beta}$ is stored within the control unit 4 and used to obtain information about the spectral composition of the light radiation impinging on the sensor 1.

The mathematical approach used for the extrapolation of spectral information, according to equation (3), involves the use of operations of sum and multiplication.

Summarizing the above, the sensor apparatus 20 is subject to a calibration procedure, designed to measure the spectral response by varying continuously the bias voltage $V_B$ applied to it. The result of this calibration procedure is used for the definition of the spectral responsivity matrix $\overline{R}$ and the vector of weights $\overline{\beta}$ to be stored in the analysis and control device 4 for use in subsequent phases.

In the operation of the sensor apparatus 20, it is illuminated with the radiation whose power spectrum needs to be reconstructed, and the bias voltage $V_B$ is continuously varied in a manner similar to what occurred in the calibration step. The acquired photocurrent signal (i.e., the photocurrent vector $\overline{\iota_{ph}}$) is transferred to the analysis and control device 4 for further processing.

The photocurrent signal is processed by the analysis and control device 4 using the vector of weights $\overline{\beta}$ obtained by calibration. The result of the processing, i.e., the spectral density $\overline{P}$ as a function of wavelength, represents the power spectrum of the measured optical radiation.

In accordance with a second embodiment of the system 100, the system can be configured to operate as a hyperspectral imaging system, i.e., a hyperspectral imaging system IPST-IM. In this case, the sensor apparatus 20 includes a plurality of sensor devices 1, analogous to the sensor described above, organized according to a matrix. For example, the sensor apparatus 20 may include millions of sensors 1 each corresponding to a pixel of the hyperspectral image to be acquired.

The electronic control and processing module 50 is, in this case, configured to receive the photocurrents Iph provided by each sensor 1 (corresponding to a pixel) and process them, in a manner analogous to that described above, to obtain the hyperspectral image, in which for each pixel the image spectrum of a scene is provided.

Note that, with reference to the structure of the sensor 1, other forms of realization are possible, some of which will be described below.

According to an alternative embodiment form of sensor 1 (not shown in the figures), in order to simplify the construction processes, the first silicon diode PD1 is formed by a p-n-n diode in which the n− type area has a dopant density between $10^{15}$ cm$^{-3}$ e $10^{16}$ cm$^{-3}$. Higher dopants reduce the overall efficiency of the sensor; lower dopants, on the other hand, provide acceptable performance but are technologically more complex to implement.

In accordance with another alternative embodiment (also not shown in the figures), it is contemplated to replace the n-layer of germanium (e.g., the second doped layer 8 of FIG. 1) with a layer formed by a SixGe1-x germanium-silicon alloy with decreasing germanium percentage and n-type doping, in order to increase the responsivity modulation capability by applied voltage.

In addition to the use of several possible semiconductor materials, the sensor 1 can be fabricated to present several possible structures. In the following, possible alternative structures of the sensor 1 will be described.

Figure 4:
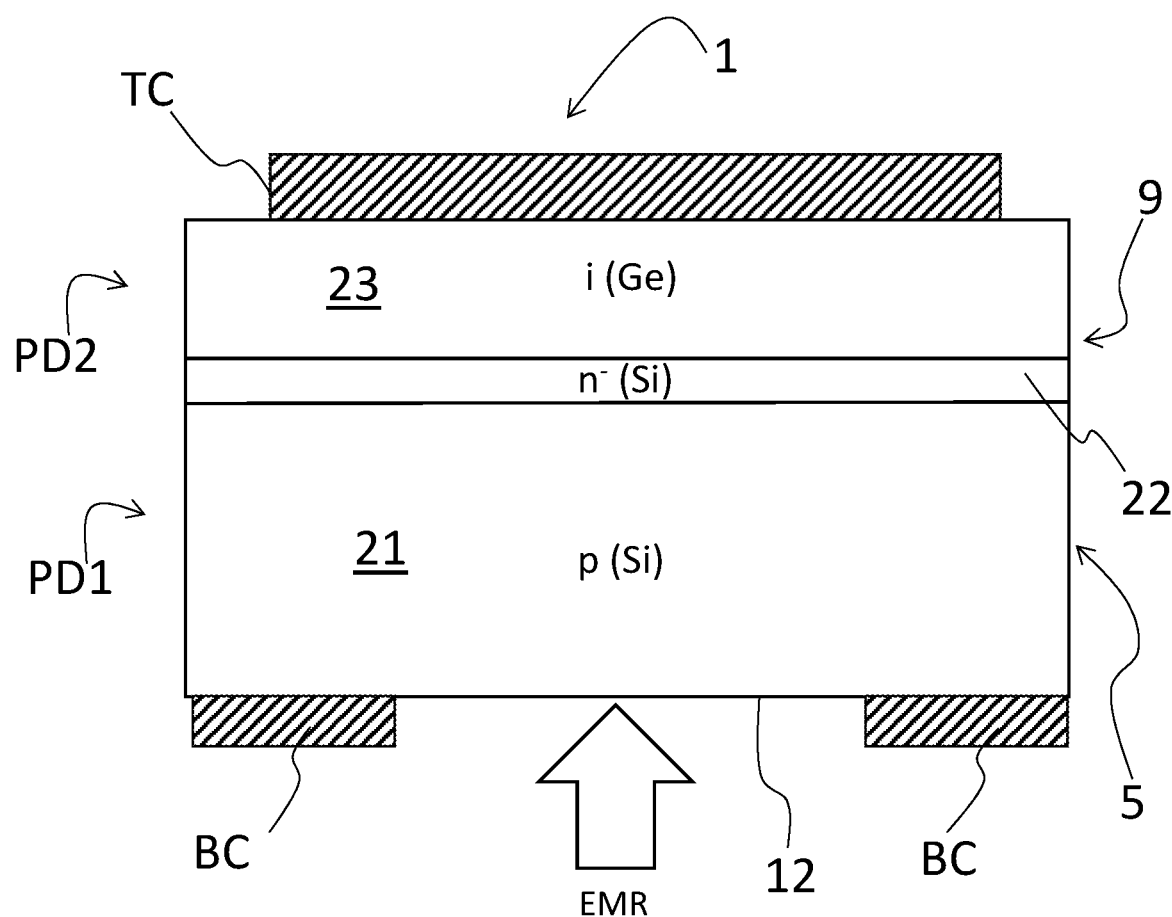
FIG. 4 shows a section of a second form of realization of said sensor.

FIG. 4 refers to a second embodiment of the sensor 1 described, by way of example, again with reference to silicon and germanium.

According to the example of FIG. 4, within the substrate 5, the first diode PD1 is formed by a first layer 21 (silicon, p-type) on which a second layer 22 (silicon, n-type) is laid out above, without the presence of an intrinsic silicon layer. The second diode PD2 of the sensor 1 in FIG. 4 consists of the same first layer 22 (common cathode) and a third layer 23 (in germanium, intrinsic) that behaves as a p-type semiconductor (anode for the second PD2 diode). The structure of sensor 1 in FIG. 4 is particularly compact.

Figure 5:
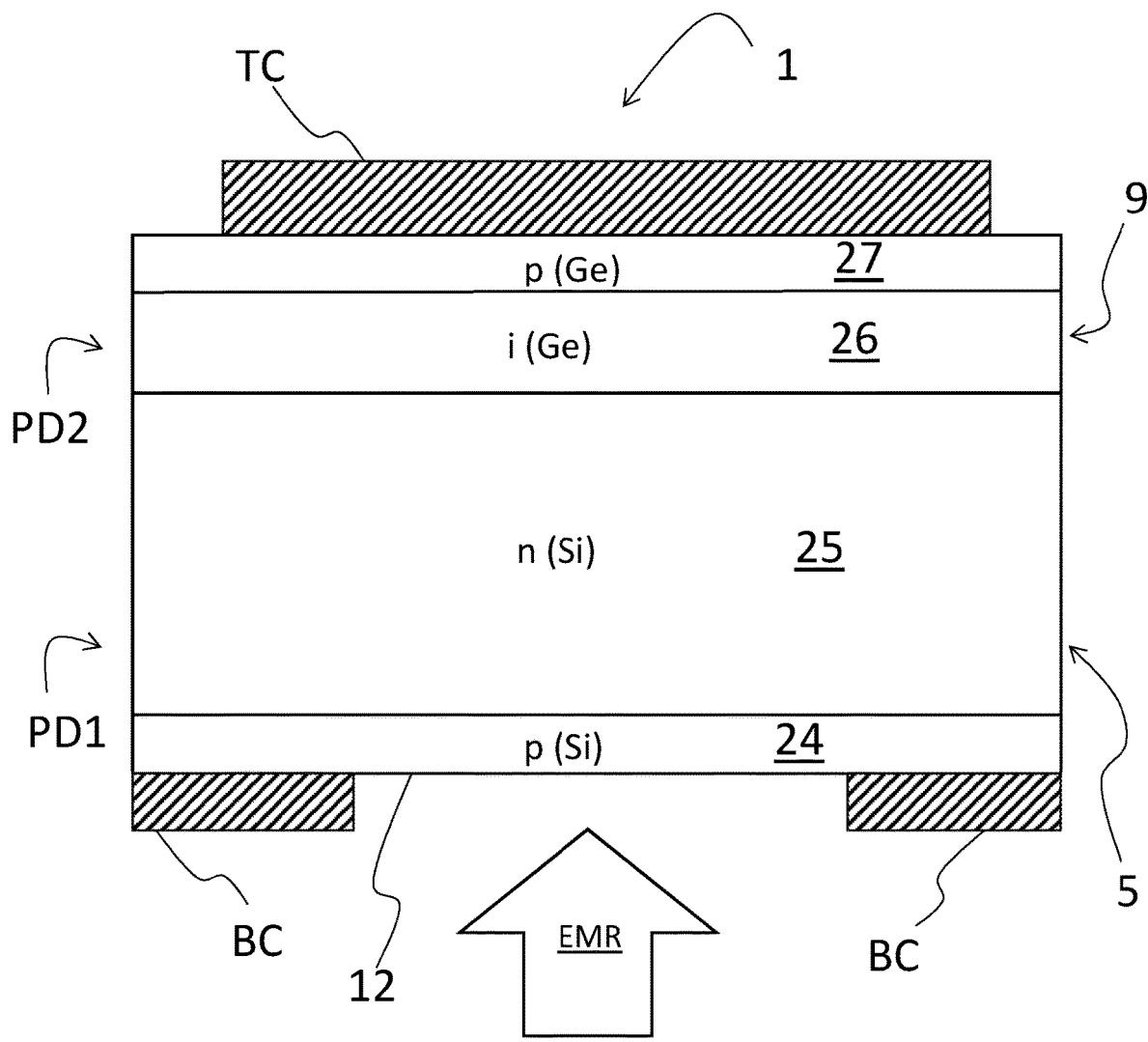
FIG. 5 shows a section of a third form of realization of said sensor.

FIG. 5 shows a third form of realization, of compact type, still, exemplifying and not limiting, referring to the use of silicon and germanium. The first diode PD1 is formed by a first silicon layer 24 (p-type) and a second silicon layer 25 (n-type), without the presence of an intrinsic silicon layer. The second diode PD2 in FIG. 5 consists of a first germanium layer 26 (n-type) and an intrinsic layer 27, made of germanium, which operates as a p-type semiconductor.

Figure 6:
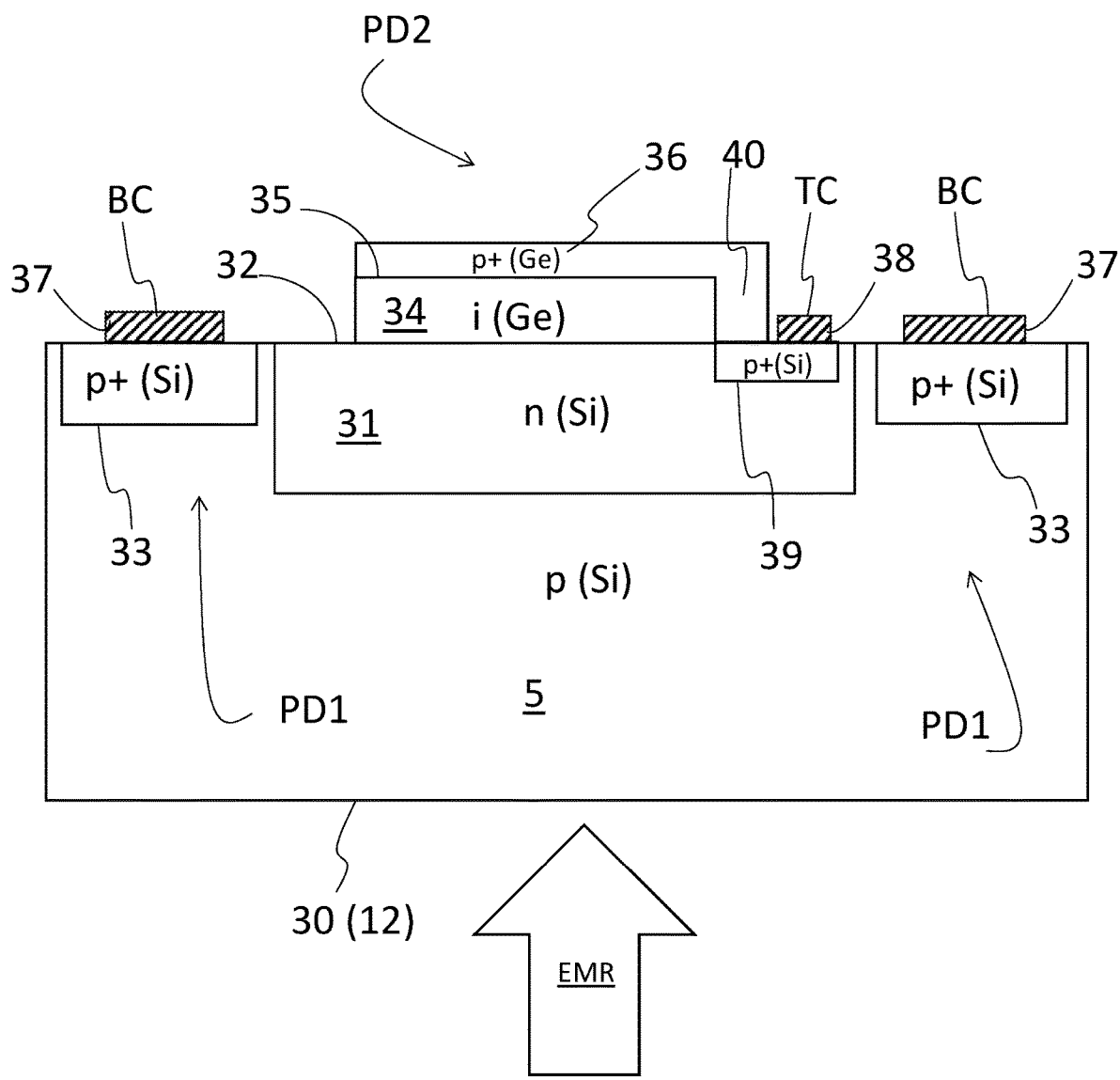
FIG. 6 shows a section of a fourth form of realization of said sensor.

FIG. 6 refers to a fourth form of realization of the sensor 1 described, by way of example, with reference to germanium and silicon but for which the same considerations set forth above with respect to possible alternative materials that can be used apply.

According to this form of embodiment, the sensor 1 comprises a relative substrate 5 in a first semiconductor material (in the example, shown, silicon) having, for example, a p-type doping, which defines a first face 30 and an opposing second face 32. The first face 30 constitutes the exposed region 12 from which the EMR radiation penetrates. Note that the substrate 5 of sensor 1 in FIG. 6 may be n-type.

A first doped region 31 (n-Si) is formed in the substrate 5, of the same material as the substrate, but with a doping opposite to that of the substrate 5 and that is, according to the example, with an n-type doping. The first doped region 31 extends from the second face 32 of the substrate 5 towards the interior of the substrate itself, without reaching, the first face 30.

Note that said first doped region 31 is intended to operate as a common electrode (according to the example, a cathode) to the first diode PD1 and the second diode PD2.

A second doped region 33 is formed within the substrate 5 having, according to the example, a doping of the same type as the substrate 30 but higher, i.e., a p+ type doping. The second doped region 33 extends from the second face 32 inwardly of the substrate 5, without reaching the first face 30, with a depth less than that of the first doped region 31. For example, the second doped region 33 extends within the substrate 5 so as to laterally surround, in a ring, the first doped region 31.

Note that the second doped region 33 is intended to act as an additional electrode (in this example, as an anode) for the first diode PD1.

Further, the sensor 1 according to the fourth embodiment comprises a layer made of a second semiconductor material 34 (made of germanium, according to the example) disposed on the second face 32 of the substrate 5 and so as to be in contact with the first doped region 31. Said germanium layer 34 is, for example, intrinsic germanium. The germanium layer 34 and such as to define a third face 35 opposed to the second face 32.

The intrinsic germanium layer 34 results facing part of the first doped region 31 (in particular, to a central portion thereof), without entirely covering it.

Note that, according to the example, the germanium layer 34 is intended to operate as the intrinsic layer of the second diode PD2.

Over the third face 35 of the intrinsic germanium layer 34 is disposed a doped layer 36 (in germanium) having, according to the example, a high p-type doping (i.e., a p+ doping). The doped layer 36 is intended to act as an anode for the second PD2 diode.

According to the example in FIG. 6, the sensor 1 has a first metal layer 37 disposed above the second doped region 33 (i.e., the anode of the first PD1 diode) to form the first ohmic contact BC.

Further, the sensor 1 includes a second metal layer 38 (forming the second ohmic contact TC) electrically connected to the doped layer 36.

The connection between the second ohmic contact TC and the doped layer 36 (i.e., the anode of the second diode PD2) is made by a first high-doped well 39 (i.e., a high-conductivity well) and a second high-doped well 40.

The first high-doped well 39 extends from the second face 32 inwardly into the first doped region 31 (n-type) and has, according to the example, a p+ doping. The second ohmic contact TC is disposed on the second face 32 in contact with a portion of the high doping well 39.

The second high-doped well 40 extends, within the germanium layer 34, from the doped layer 36 (with which it is in contact) to the first high-doped well 39 at the second face 32. According to the example, the second high doped well 40 is in p+ doped germanium.

Summarizing, the first diode PD1 comprises the first doped region 31, a portion of the substrate 5, and the second doped region 33. The second diode PD2 comprises the first doped region 31, the intrinsic germanium layer 34, the doped layer 36, the first and second high-doped wells 39 and 40.

The first doped region 31, the second doped region 33, the first high-doped well 39 and the second high-doped well 40 may be formed by implantation techniques and/or by spin-on dopant and/or deposition techniques including epitaxy, sputtering, evaporation.

The intrinsic germanium layer 34 can be made by chemical and/or physical deposition techniques such as epitaxy, sputtering, evaporation, or even transfer as wafer bonding. The intrinsic germanium layer 34 is entirely within the first doped region 31 of the silicon substrate 5 and, therefore, it is possible to deposit the intrinsic germanium layer 34 by techniques such as selective deposition (e.g., oxide window deposition), or it is possible to deposit the germanium layer 34 over the entire substrate 5 and then define the geometry of the layer 34 itself by selective removal techniques (photolithography).

The embodiment of FIG. 6 is not complex to fabricate and, moreover, has the advantage of presenting the metal contacts of the sensor on the same side of the substrate 5 in which it is integrated resulting, therefore, in a "planar" type.

The Spectrum Detection System 100 is used, for example, in the automotive sector (Fog, Night Vision, augmented vision), in the Machine Vision sector (Industry 4.0, increased machine vision) or in the plastics recycling sector.

The system 100 described above, in its various embodiments, is very advantageous.

In particular, since it allows a wide modulation of the spectral response, it makes it possible to have a large number of different spectral responses, such as to allow the realization of effective algorithms of spectral reconstruction, without resorting to complex optical and mechanical structures as is the case in the known art, obtaining excellent performance. In fact, the structural simplification leads to greater robustness as well as greater compactness.

Moreover, the possibility of integrating the electronic modules in the same silicon substrate further reduces the structural complexity of the system 100 and the related costs.

LIST OF FIGURE NUMBERS spectrum detection system 100
electromagnetic radiation sensor apparatus 20
electronic control and processing module 50
sensor 1
output OU
reading module 2
conditioning module 3
analysis and control device 4
first photodiode PD1
second photodiode PD2
photocurrent Iph
substrate 5
first doped layer 6
first intrinsic layer 7
second doped layer 8
epitaxial layer 9
second intrinsic layer 10
third doped layer 11
first BC ohmic contact
second ohmic contact TC
exposed region 12
bias voltage VB
voltage signal Vph
digital voltage values Vbi
first layer 21
Second layer 22
third layer 23
first layer silicon 24
second layer silicon 25
first germanium layer 26
intrinsic layer 27
first face 30
first doped region 31
second face 32
second doped region 33
layer in a second semiconductor material 34
third face 35
doped layer 36
first metallic layer 37
second metallic layer 38
first high doping pocket 39
second high doping pouch 40

The invention claimed is:

1. An electromagnetic radiation spectrum detection system comprising:
a sensor device comprising two photodiodes in a "back-to-back" configuration, wherein the sensor device is configured to convert an incident electromagnetic radiation (EMR) into electrical current as a function of a respective spectral responsivity dependent on an electrical adjusting voltage; and
an electronic control and processing module;
wherein the electronic control and processing module stores a plurality of numerical calibration values representative of a responsivity matrix of the sensor device, the plurality of numerical calibration values being obtained by varying a photo-response of the sensor device in a continuous manner by varying the electrical adjusting voltage;
wherein the electronic control and processing module selectively provides the sensor device with a plurality of electrical control voltage values ($V_B$) by varying in a continuous mode the spectral responsivity to obtain a corresponding plurality of detected electrical currents (Iph) associated with the incident electromagnetic radiation; and
wherein the electronic control and processing module processes the values of the plurality of detected electric currents (Iph) and the plurality of numerical calibration values to obtain spectrum information (SP-ANS; IPST-IM) related to incident electromagnetic radiation spectrums;
wherein the electronic control and processing module determines power spectral density of the incident electromagnetic radiation for a plurality of optical wavelengths.

2. The electromagnetic radiation spectrum detection system according to claim 1, wherein the electronic control and processing module selects at least one of the plurality of optical wavelengths of the incident electromagnetic radiation detectable by the sensor device based on the values of electrical adjuting voltage ($V_B$) that vary the responsivity of the sensor device.

3. The electromagnetic radiation spectrum detection system according to claim 1, wherein the electronic control and processing module linearly combines lines of the responsivity matrix of the sensor device to obtain a synthetic respositity matrix to be processed to determine the power spectral density of the incident electromagnetic radiation.

4. The electromagnetic radiation spectrum detection system according to claim 1, wherein the spectrum detection system performs spectral analysis (SP-ANS) of the electromagnetic radiation incident.

5. The electromagnetic radiation spectrum detection system according to claim 1, further compriseing a single sensor device.

6. The electromagnetic radiation spectrum detection system according to claim 1, further comprising a least one additional sensor device that is configured the same as the sensor device and arranged together with the sensor device to form a matrix of sensor devices that identify their pixels;
wherein the electronic control and processing module provides the matrix of sensor devices with a plurality of electrical adjusting voltage values ($V_B$) by varying the spectral responsivity of each sensor device to obtain a plurality of detected electrical currents (Iph) associated with the incident electromagnetic radiation; and
wherein the electronic control and processing module processes the detected electric currents (Iph) based on the plurality of electrical adjusting voltage values (VB) and the spectral responsivity of each sensor device resulting in the acquisition of a hyperspectral image (IPST-IM) associated with such pixels.

7. The electromagnetic radiation spectrum detection system according to claim 1, wherein the sensor device further comprises a first photodiode (PD1) that is in a first semiconductor material, and a second photodiode (PD2) that is at least partially in a second semiconductor material; wherein the first and second diodes have respective cathodes or anodes electrically connected each other.

8. The electromagnetic radiation spectrum detection system according to claim 7, wherein the first photodiode (PD1) comprises a substrate in the first semiconductor material into which are integrated: a first layer having a first type of doping, a second layer having a second type of doping opposite to the first type of doping.

9. The electromagnetic radiation spectrum detection system according to claim 8, wherein the substrate of the first photodiode (PD1) includes an intrinsic layer in the first semiconductor material.

10. The electromagnetic radiation spectrum detection system according to claim 8, wherein the second layer is shared with the first photodiode (PD1); wherein the second photodiode (PD2) includes an integration layer in the second semiconductor material overlapping the substrate; and wherein the substrate includes an intrinsic layer and a first doped layer having a doping opposite to the doping of the second layer included in the substrate.

11. The electromagnetic radiation spectrum detection system according to claim 7, wherein the first and/or second photodiode (PD1, PD2) comprises semiconductor materials chosen from a group comprising of semiconductors III-V and their alloys, semiconductors II-VI and their alloys, and semiconductors IV and their alloys.

12. The electromagnetic radiation spectrum detection system according to claim 7, wherein the sensor device further comprises:

a substrate in a first semiconductor material so as to define a first face exposed to electromagnetic radiation (EMR) and a second face opposite the first face;

a first doped region included in the substrate so as to extend to the second face and having a first type of doping;

a second doped region included in the substrate so as to extend to the second face, separated from the first region by a portion of the substrate, having a second type of dopant;

a layer in a second semiconductor material placed on the second face in contact with the first doped region and such as to define a third face opposite the second face;

a doped layer in the second semiconductor material comprising the second type of dopant and overlapping the third face; and a plurality of metal contacts arranged so as to contact the second doped region at the second face and the doped layer in the second semiconductor material;

wherein the first doped region, the portion of the substrate, and the second doped region are each a part of the first photodiode (PD1) of the sensor device; and wherein the first doped region, the layer in the second semiconductor material, and the doped layer in the second semiconductor material are each a part of the second photodiode (PD2) of the sensor device.

13. The electromagnetic radiation spectrum detection system according to claim 7, wherein the control and processing module is integrated into the silicon substrate in which the first photodiode (PD1) is integrated.

14. The electromagnetic radiation spectrum detection system according to claim 7, wherein the first semiconductor materials and the second semiconductor materials are selected so that the sensor device operates between the visible, near-infrared, and the short-wave infrared.

* * * * *